(12) United States Patent
Saarnimo

(10) Patent No.: US 7,379,712 B2
(45) Date of Patent: May 27, 2008

(54) WEARABLE DEVICE

(75) Inventor: Timo Saarnimo, Espoo (FI)

(73) Assignee: Suunto Oy, Vantaa (FI)

( * ) Notice: Subject to any disclaimer, the term of this patent is extended or adjusted under 35 U.S.C. 154(b) by 418 days.

(21) Appl. No.: 09/769,851

(22) Filed: Jan. 25, 2001

(65) Prior Publication Data

US 2002/0098807 A1 Jul. 25, 2002

(51) Int. Cl.
*H04B 1/38* (2006.01)
*H01Q 11/12* (2006.01)

(52) U.S. Cl. .................... 455/90.3; 455/351; 455/347; 455/575.7; 343/741

(58) Field of Classification Search ............... 455/90.3, 455/351, 347, 575.7
See application file for complete search history.

(56) References Cited

U.S. PATENT DOCUMENTS

| | | | |
|---|---|---|---|
| 4,977,614 A | 12/1990 | Kurcbart | |
| 5,768,217 A * | 6/1998 | Sonoda et al. | 368/10 |
| 5,781,155 A | 7/1998 | Woo et al. | |
| 5,926,144 A * | 7/1999 | Bolanos et al. | 343/718 |
| 5,977,921 A * | 11/1999 | Niccolai et al. | 343/741 |
| 6,100,804 A * | 8/2000 | Brady et al. | 340/572.7 |
| 6,255,995 B1 * | 7/2001 | Asano et al. | 343/700 MS |
| 6,278,873 B1 * | 8/2001 | Itakura et al. | 455/351 |
| 6,762,728 B2 * | 7/2004 | Koyama et al. | 343/718 |
| 6,825,751 B1 * | 11/2004 | Kita et al. | 340/5.61 |

* cited by examiner

*Primary Examiner*—Yuwen Pan
(74) *Attorney, Agent, or Firm*—Wolf, Block, Schorr & Solis-Cohen LLP

(57) ABSTRACT

A wearable device comprises one or more circuit substrates comprising electrically conductive parts, a radio unit and a loop antenna coupled to the radio unit. The loop antenna comprises a conductor formed into a loop, wherein the electrically conductive parts of at least one of said one or more circuit substrates substantially act as a ground plane for the loop antenna. Said at least one circuit substrate is positioned substantially on the same plane with the loop and such that at least the electrically conductive parts of said at least one circuit substrate are within an area defined by the loop when said at least one circuit substrate and the loop are observed perpendicularly with respect to a plane of the loop in order to minimize the ground plane effect of the electrically conductive parts of said at least one circuit substrate on the loop antenna.

19 Claims, 2 Drawing Sheets

WEARABLE DEVICE

FIELD OF THE INVENTION

The present invention relates to wearable devices, and more particularly to wearable devices comprising an antenna.

BACKGROUND OF THE INVENTION

Wearable devices such as wrist-worn devices can nowadays comprise a plurality of functions. Examples of such functions are time display, measurement and display of various physical quantities like temperature, air pressure, heart beat rate and so on. A wearable device can also comprise a radio unit for receiving and/or sending radio signals, for instance a GPS receiver (Global Positioning System).

Integrating an antenna into a wearable device comprising a radio unit can be problematic because other electronics in the device, particularly a circuit substrate, such as a printed circuit board, comprising conductive parts, may act as a ground plane for the antenna and deteriorate the performance of the antenna. Also the proximity of a human body can deteriorate the performance of the antenna especially in a wrist-worn device. Furthermore, a wearable device is typically of limited size and on the other hand the antenna should not be very protruding which also constricts the antenna design.

A commonly used antenna type that can be placed inside a wearable device is a so-called patch antenna. A patch antenna typically comprises a planar radiator and a ground plane parallel thereto. A problem with the patch antenna type is the relatively large surface area it has on account of which it can be difficult to place a patch antenna inside a wearable device, especially a small wearable device.

U.S. Pat. No. 4,977,614 describes an antenna incorporated into a wristband of a wrist-worn device. A problem with this kind of antenna design is that the antenna may be strongly coupled to the wrist of a user thus impairing the antenna performance.

U.S. Pat. No. 5,926,144 describes an antenna located within the housing of a wearable electronic device. In the solution presented the antenna is a loop antenna which is positioned vertically with respect to the housing of the device. A problem with this kind of design is that it potentially increases the vertical space needed inside the housing.

U.S. Pat. No. 5,768,217 describes also an antenna located within the housing of a wearable electronic device. In the solution presented the antenna is a loop antenna which is positioned horizontally with respect to the housing of the device on top of the circuit board and the components therein. The potential problem with this kind of design is that especially the circuit board may act as a ground plane for the antenna and affect the performance of the antenna in an undesirable way.

SUMMARY OF THE INVENTION

An object of the present invention is thus to provide a wearable device comprising an antenna such that the antenna performance is improved. It is another object of the invention to provide a wearable device comprising an antenna such that the antenna can easily be integrated into the device.

The objects of the present invention are achieved by providing a wearable device comprising: one or more circuit substrates comprising electrically conductive parts; a radio unit; and a loop antenna coupled to the radio unit, the loop antenna comprising a conductor formed into a loop, wherein the electrically conductive parts of at least one of said one or more circuit substrates substantially act as a ground plane for the loop antenna and wherein said at least one circuit substrate is positioned substantially on the same plane with the loop and such that at least the electrically conductive parts of said at least one circuit substrate are within an area defined by the loop when said at least one circuit substrate and the loop are observed perpendicularly with respect to a plane of the loop in order to minimize the ground plane effect of the electrically conductive parts of said at least one circuit substrate on the loop antenna.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein.

DETAILED DESCRIPTION OF THE INVENTION

Figure 1:
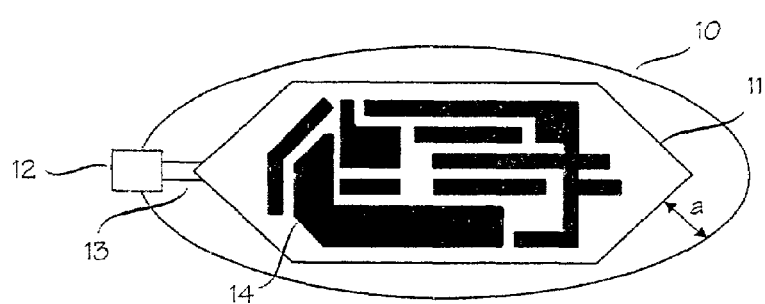
FIG. 1 is a plan view drawing showing the positioning of the circuit substrate and the antenna in accordance with an embodiment of the present invention.

Referring to FIG. 1, the wearable device comprises at least one circuit substrate 11 comprising electrically conductive parts 14. The circuit substrate 11 is for example a printed circuit board which comprises a number of conductors 14 as illustrated in a simplified manner. The electrically conductive parts 14 may also comprise electronic components mounted on the circuit substrate 11. The wearable device also comprises a radio unit (not shown in FIG. 1) preferably mounted on the circuit substrate 11 and a loop antenna 10 coupled 12 and 13 to the radio unit. The loop antenna 10 comprises a conductor formed into a loop. The shape of the loop of the antenna 10 can be a circle, a square, a polygon, an ellipse, a toroid or it can have a free shape, for instance. The length of the loop of the antenna 10 is preferably equal to a wavelength corresponding to the radio frequency that the radio unit using the antenna 10 operates at. The length can be, however, also less than said wavelength or a multiple thereof. The electrically conductive parts 14 of the circuit substrate 11 can act as ground plane for the loop antenna 10 which can affect the performance of the antenna 10 in an unwanted way. According to the invention, in order to minimize the ground plane effect of the electrically conductive parts 14 of the circuit substrate 11 on the loop antenna 10 the circuit substrate 11 is positioned substantially on the same plane with the loop 10 and such that at least the electrically conductive parts 14 of the circuit substrate 11 are within the area defined by the loop 10 when the circuit substrate 11 and the loop 10 are observed perpendicularly with respect to the plane of the loop. In other words when the circuit substrate 11 and the loop 10 are projected onto the plane of the loop, at least the electrically conductive parts 14 of the circuit substrate 11 are inside the two-dimensional area formed within the loop 10. The circuit substrate 11 can be positioned entirely within the area defined by the loop 10 as illustrated. However, the essential point is that at least the electrically conductive parts 14 of the circuit substrate 11 that act as a ground plane for the loop antenna 10 are within the loop 10. Thus, if the circuit substrate 11 does not have such conductive parts 14 on its edge areas, it is even possible to form the loop antenna 10 on the circuit substrate 11, more particularly on the periphery of the circuit substrate 11. The distance a between the circuit substrate 11 acting as a ground plane and the loop antenna 10 has no significance to the basic idea of the invention. The distance a principally affects the feed impedance and also the resonance frequency of the antenna 10. Likewise the shape of the circuit substrate 11 is not relevant to the basic idea of the invention.

Figure 2:
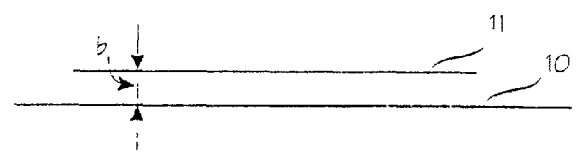
FIG. 2 is a drawing showing the positioning of the circuit substrate and the antenna in accordance with an embodiment of the present invention.
Figure 3:
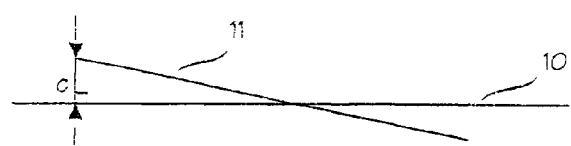
FIG. 3 is a drawing showing the positioning of the circuit substrate and the antenna in accordance with an embodiment of the present invention.

The circuit substrate 11 and the loop antenna 10 do not have to be exactly on the same plane. FIG. 2 illustrates a side view of the circuit substrate 11 and the loop antenna 10 positioned parallel to each other but on different planes the planes having a distance b between them. FIG. 3 illustrates a side view of the circuit substrate 11 and the loop antenna 10 positioned on different planes when the planes are at different angles. In this case the circuit substrate 11 and the loop antenna 10 have a maximum distance c when measured perpendicularly to the plane formed within the periphery of the loop conductor 10. The applicant has observed that the ground plane effect of the electrically conductive parts 14 of the circuit substrate 11 on the loop antenna 10 is best minimized when the distance between a plane formed within the periphery of the circuit substrate 11 and the plane formed within the periphery of the loop conductor 10 when measured from any given point of the plane formed within the periphery of the circuit substrate 11 perpendicularly to the plane formed within the periphery of the loop conductor 10, i.e. distance b or c, is about or less than 0.1 times a wavelength corresponding to the radio frequency that the radio unit operates at if the radio unit has several operating frequencies, the appropriate maximum distance b or c can be defined by using the radio frequency having the longest wavelength, for example. The wearable device can also comprise more than one circuit substrate 11 whereby it is preferable to position all circuit substrates that comprise electrically conductive parts 14 that substantially act as a ground plane for the loop antenna 10 and thus deteriorate the performance of the antenna 10 as described above.

In order to further improve the performance of the loop antenna 10 the loop antenna is preferably coupled to the radio unit via balancing means. The use of balancing means reduces the currents on the circuit substrate 11 acting as a ground plane excited by the antenna 10 and further reduces the effect of the circuit substrate 11 on the performance of the antenna 10. The use of balancing means also reduces the effect of a human body on the performance of the antenna 10 especially when the wearable device is worn near the body of a user. The balancing means can be a balancing transformer 12 (also called as balun) coupled between the loop antenna 10 and the transmission line 13 coupling the antenna 10 to the radio unit. The balancing transformer or balun refers, in general, to a device that joins a balanced line or device (one that has two conductors, with equal currents in opposite directions, such as the antenna 10) to an unbalanced line or device (one that has just one conductor and a ground, such as the transmission line 13). In other words it is used to convert an unbalanced signal to a balanced one or vice versa. The balancing transformer 12 isolates the transmission line 13 and provides a balanced output. In the balancing transformer 12, one pair of terminals is balanced, that is, the currents are equal in magnitude and opposite in phase. The other pair of terminals is unbalanced; one side is connected to electrical ground and the other carries the signal. Alternatively it is possible to use a balanced transmission line 13 between the loop antenna 10 and the radio unit whereby the balancing transformer 12 is not needed between the antenna 10 and the balanced transmission line 13. The detailed design of the possible balancing transformer 12 or the balanced transmission line 13 depends on the particular application the invention is used in and is considered obvious to a person skilled in the art.

Figure 4:
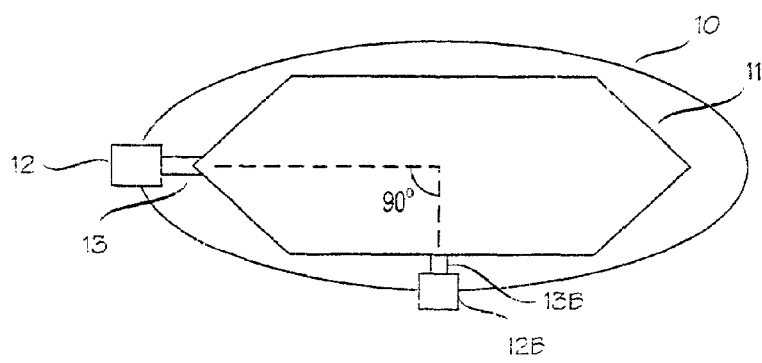
FIG. 4 is a drawing showing the positioning of the circuit substrate and the antenna in accordance with an embodiment of the present invention.

Typically the polarization used on the loop antenna 10 is linear polarization but it is also possible to use circular polarization. FIG. 4 illustrates an alternative embodiment of the invention where the loop antenna 10 is coupled to the radio unit at two separate points (for example balancing transformers) 12 and 12B located substantially 90° apart from each other on the conductor loop of the loop antenna 10 with respect to the center of the conductor loop 10 in order to enable the use of circular polarization. This alternative embodiment also requires two different transmission lines 13 and 13B as illustrated. In addition either of the feeding points 12 or 12B should be fed in phase quadrature with respect to the other feeding point in order to generate circular polarization. The above described design for circular polarization by using two coupling points on a loop antenna is described in more detail for example in U.S. Pat. No. 5,977,921 and incorporated herein by reference.

Figure 5:
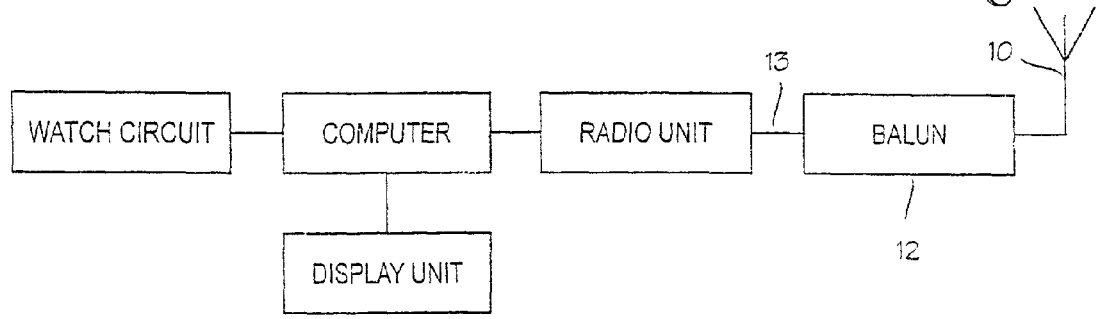
FIG. 5 is a block diagram of a wearable device in accordance with an embodiment of the present invention.

FIG. 5 illustrates in a simplified manner a block diagram of a wearable device in accordance with an embodiment of the present invention. The wearable device comprises for example a computer or similar controlling unit, a display unit for displaying information to a user, a watch circuit for providing conventional watch functions, a radio unit for receiving and/or sending radio signals and an antenna 10 connected 12 and 13 thereto. The invention is not limited to any particular type of a wearable device but it can be used in connection with many types of such devices this being considered obvious to a person skilled in the art. The term wearable device should be understood broadly and refers to all kinds of devices that can be attached to a user or clothes of a user or that can be carried in a pocket or a bag of a user, for example. A wearable device can also be a device that is primarily a hand-held device.

Figure 6:
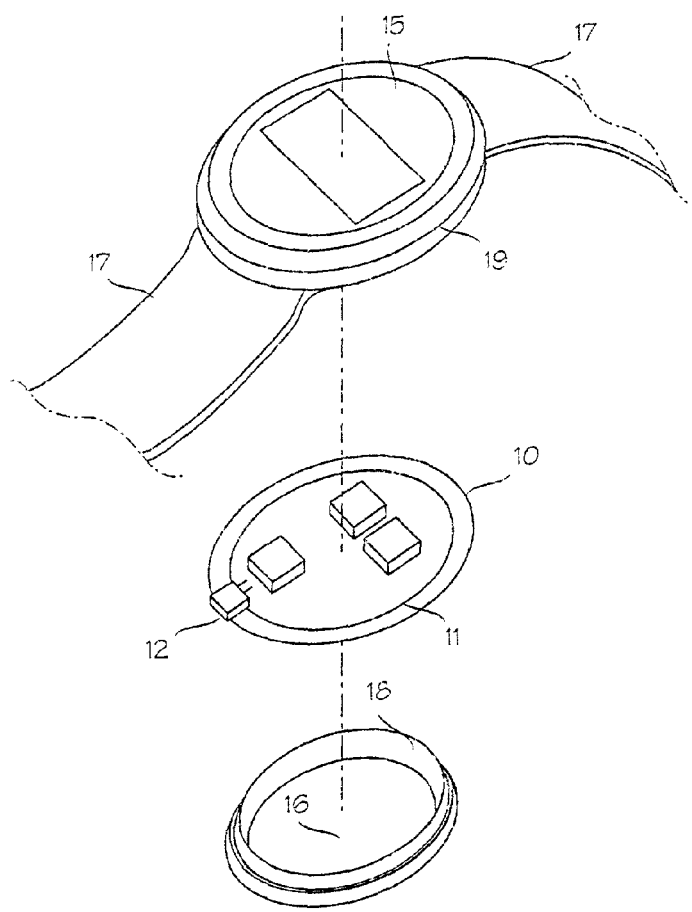
FIG. 6 is an exploded view of a wearable device utilizing an internal antenna in accordance with an embodiment of the present invention.

FIG. 6 illustrates an exploded view of an example of a wearable device according to the invention. Besides the circuit substrate 11 and loop antenna 10 the device comprises an upper housing 15 and a lower housing 16. The upper housing 15 and the lower housing 16 form a cavity when they are attached together into which cavity the circuit substrate 11 and the antenna 10 are fitted. Furthermore the device can comprise a wrist band 17 for wearing the device on the wrist of a user. The wearable device can also comprise other kind of means for attaching it to a user or clothes of a user, for example. Such means can be a neck strap or a wrist lanyard or a pocket clip, for example. The housing 15 and 16 of the wearable device is preferably of non-conducting material such as plastic in order not to disturb the operation of the antenna 10. In a construction like the one illustrated the antenna 10 can be attached to the circuit substrate 11 and/or to the inner surface 18 of the housing. The antenna 10 can also be integrated inside the bezel 19 of the housing or some other part of the housing 15 and 16, for example. The wearable device can comprise more additional components than shown in FIG. 6. Also the shape of the housing 15 and 16 can vary without that it has any importance to the basic idea of the invention.

The present invention is particularly suitable to be used in connection with a GPS receiver. The reason for this is that at a GPS frequency 1575 MHz a circular loop antenna having a length of a wavelength corresponding to said frequency has a diameter of about 50 mm making it suitable in size to be used in a wrist watch type housing, for example. An example of a wearable device comprising a GPS receiver in general is described in more detail for example in U.S. Pat. No. 5,781,155 and incorporated herein by reference. The invention is also suitable for other wireless communications applications, such as a pager, a mobile station or a radiotelephone, that require an antenna for receiving and/or sending radio signals.

It will be obvious to a person skilled in the art that, as the technology advances, the inventive idea can be implemented in various ways. The invention and its embodiments are not limited to the examples described above but may vary within the scope of the following claims.

What is claimed is:

1. A wearable device comprising:
   one or more circuit substrates comprising electrically conductive parts being disposed in at least a first plane;
   a radio unit operating at a radio frequency; and
   a loop antenna coupled to the radio unit, the loop antenna consisting of a single loop formed of a conductor, the loop defining an area and being disposed in a second plane; wherein the electrically conductive parts of at least one of said one or more circuit substrates substantially act as a ground plane causing a ground plane effect for the loop antenna and wherein said first plane is substantially coplanar with said second plane and such that at least the electrically conductive parts of said at least one circuit substrate are within said area defined by the loop when observed in plan view minimizing the ground plane effect of the electrically conductive parts of said at least one circuit substrate on the loop antenna.

2. The wearable device of claim 1, wherein the radio unit is mounted on one of said one or more circuit substrates.

3. The wearable device of claim 1, wherein said at least one circuit substrate is positioned entirely within the area defined by the loop, when said at least one circuit substrate and the loop are observed perpendicularly with respect to the second plane.

4. The wearable device of claim 1, wherein the loop antenna is formed on the periphery of said at least one circuit substrate.

5. The wearable device of claim 1, wherein the loop antenna is coupled to the radio unit via a balancing means.

6. The wearable device of claim 5, wherein the balancing means comprises a balancing transformer.

7. The wearable device of claim 5, wherein the balancing means comprises a balanced transmission line.

8. The wearable device of claim 1, wherein said at least one circuit substrate and the second plane have a maximum vertical distance of about 0.1 times a wave length corresponding to the radio frequency that the radio unit operates at wherein the vertical distance is measured perpendicular to the second plane.

9. The wearable device of claim 1, wherein the loop antenna is coupled to the radio unit via a balancing means at two separate points located substantially 90° apart from each other on the conductor loop of the loop antenna with respect to the center of the conductor loop in order to enable the use of circular polarization.

10. The wearable device of claim 9, wherein the balancing means comprises a balancing transformer.

11. The wearable device of claim 9, wherein the balancing means comprises a balanced transmission line.

12. The wearable device of claim 1, wherein the length of the conductor of the loop antenna is substantially equal to a wavelength corresponding to the radio frequency at which the radio unit operates.

13. The wearable device of claim 1, wherein said at least one circuit substrate is a printed circuit board.

14. The wearable device of claim 1, wherein the radio unit comprises a radio receiver and/or a radio transmitter.

15. The wearable device of claim 14, wherein the radio unit comprises a GPS receiver.

16. The wearable device of claim 1, wherein the wearable device comprises a display unit.

17. The wearable device of claim 1, wherein the wearable device comprises a watch circuit.

18. The wearable device of claim 1, wherein the wearable device comprises a computer.

19. The wearable device of claim 1, wherein the wearable device comprises a wrist watch type housing of electrically non-conducting material.

* * * * *